(12) United States Patent
Wittenbreder, Jr.

(10) Patent No.: US 6,650,550 B2
(45) Date of Patent: Nov. 18, 2003

(54) SYNCHRONOUS RECTIFIER SELF GATE DRIVE FOR ZERO VOLTAGE SWITCHING POWER CONVERSION CIRCUITS

(75) Inventor: Ernest H. Wittenbreder, Jr., Flagstaff, AZ (US)

(73) Assignee: Technical Witts, Inc., Flagstaff, AZ (US)

( * ) Notice: Subject to any disclaimer, the term of this patent is extended or adjusted under 35 U.S.C. 154(b) by 0 days.

(21) Appl. No.: 10/157,101

(22) Filed: May 28, 2002

(65) Prior Publication Data

US 2003/0151927 A1 Aug. 14, 2003

Related U.S. Application Data

(62) Division of application No. 10/076,008, filed on Feb. 12, 2002, now Pat. No. 6,462,963.

(51) Int. Cl.[7] .............................................. H02M 3/335
(52) U.S. Cl. ........................................ 363/16; 363/127
(58) Field of Search ............................ 363/16, 17, 59, 363/60, 127; 323/222, 224

(56) References Cited

U.S. PATENT DOCUMENTS

| 5,402,329 | A | * | 3/1995 | Wittenbreder, Jr. | .......... 363/16 |
| 6,011,703 | A | * | 1/2000 | Boylan et al. | .......... 363/21.06 |
| 6,459,600 | B2 | * | 10/2002 | Farrington et al. | .......... 363/89 |

* cited by examiner

*Primary Examiner*—Adolf D. Berhane

(57) ABSTRACT

Synchronous rectifier self drive mechanisms are revealed which are universally applicable to zero voltage switching power converters which rely on an auxiliary inductor to drive the critical turn on transition of the main switch of the power converter. The voltage wave form generated by the auxiliary inductor is well suited to synchronous rectifier self drive. Voltage limiting circuits that reduce the voltage swing of synchronous rectifier gates are also revealed. These voltage limiting circuits reduce the energy circulated into and out of the synchronous rectifier gates and protect the synchronous rectifier gate circuits from negative over voltage.

7 Claims, 3 Drawing Sheets

US 6,650,550 B2

SYNCHRONOUS RECTIFIER SELF GATE DRIVE FOR ZERO VOLTAGE SWITCHING POWER CONVERSION CIRCUITS

The subject invention is a division of a patent whose Ser. No. is 10/076,008 filed Feb. 12, 2002 now U.S. Pat. No. 6,462,963.

BACKGROUND OF THE INVENTION

1. Field of the Invention

The subject invention generally pertains to electronic power conversion circuits, and more specifically to high frequency, switched mode power electronic converter circuits.

2. Description of Related Art

One significant source of power losses in high frequency power converters is gate drive loss. Some converters have the inherent ability to provide synchronous rectifier self gate drive which results in the recirculation of gate drive energy and easy synchronous rectifier gate drive. Without a self gate drive mechanism driver circuits are required and, in many cases, these driver circuits can be complex and costly. What is needed is a simple synchronous rectifier self gate drive mechanism for zero voltage switching (ZVS) converter topologies.

In most cases a positive voltage is applied to the gate during the on state of the switch. The positive voltage should be sufficient to fully enhance the switch, but no more. Often a negative gate voltage is applied to the gate during the off state of the switch. The negative gate drive speeds up the turn off transition by increasing the current out of the gate during the transition. There is no advantage to having a negative gate voltage. The switch is fully off at zero volts or at any voltage below the gate source threshold voltage. What is needed is a circuit that can provide the high current benefits of negative gate drive, but terminate the drive current soon after the gate voltage has dropped below the threshold voltage, thereby saving gate charge and energy and providing gate negative over voltage protection.

Objects and Advantages

An object of the subject invention is to provide a simple self gate drive mechanism for synchronous rectifiers which recirculates rather than dissipates gate drive energy for synchronous rectifiers.

Another object of the subject invention is to provide a simple circuit mechanism that limits the amount of gate drive energy and protects the synchronous rectifier from negative gate voltage breakdown.

Further objects and advantages of my invention will become apparent from a consideration of the drawings and ensuing description.

These and other objects of the invention are provided by novel circuit techniques that use the small inductor employed in many ZVS circuits to provide a synchronous rectifier self gate drive mechanism. Synchronous rectifier self drive is provided by coupling a capacitor to the same small inductor used to provide drive energy for ZVS. Alternatively, the self gate drive signal can be provided by a magnetically coupled winding of the same small inductor used to provide drive energy for ZVS.

SUMMARY

The subject invention uses a small inductor which also serves as the drive energy storage mechanism, to drive a zero voltage turn on transition of a main switch to accomplish synchronous rectifier self gate drive and recovery of synchronous rectifier gate drive energy. Circuit mechanisms for use with the synchronous rectifier self gate driver which limit the gate drive energy exchanged and protect the gate from voltage breakdown are also revealed.

DESCRIPTION OF THE PREFERRED EMBODIMENTS

Figure 1:
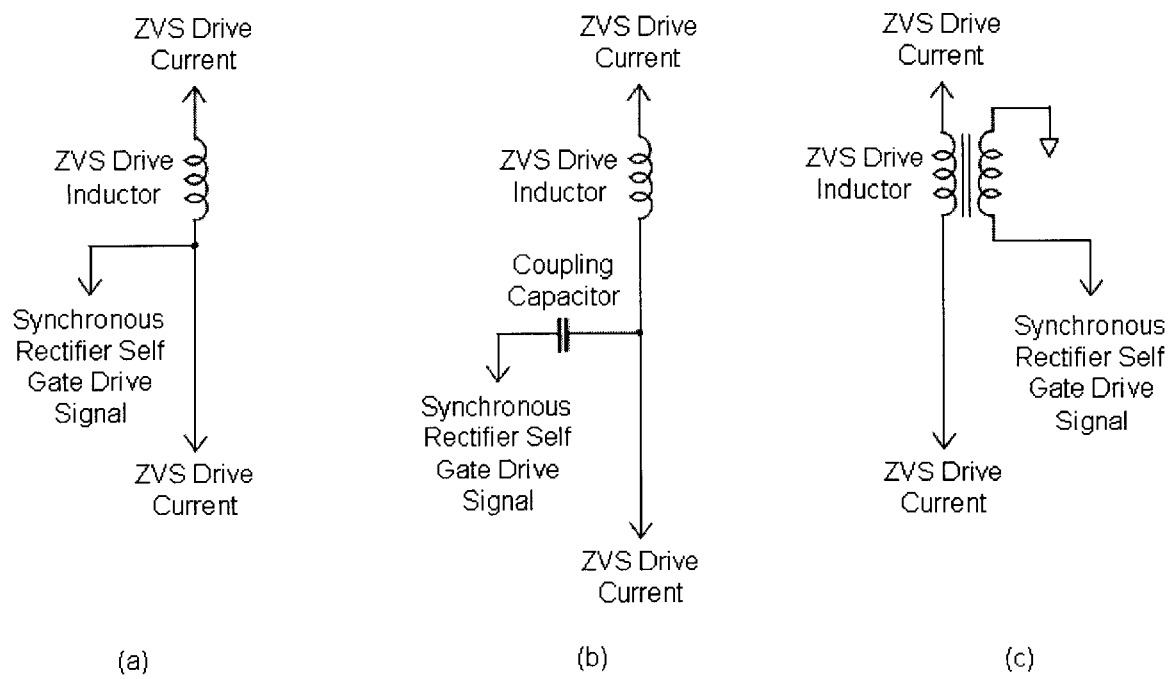
FIG. 1(a) illustrates a ZVS drive inductor with a lead provided for connecting to the gate of a synchronous rectifier for synchronous rectifier self gate drive.
FIG. 1(b) illustrates a ZVS drive inductor with a coupling capacitor provided for connecting to the gate of a synchronous rectifier for synchronous rectifier self gate drive.
FIG. 1(c) illustrates a ZVS drive inductor with a magnetically coupled secondary winding provided for connecting to the gate of a synchronous rectifier for synchronous rectifier self gate drive.
Figure 2:
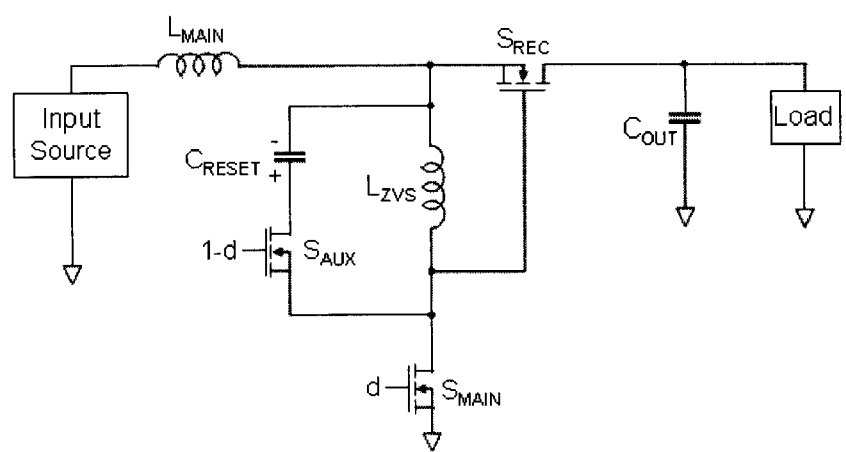
FIG. 2 illustrates a ZVS boost converter with synchronous rectifier self gate drive according to the subject invention.
Figure 3:
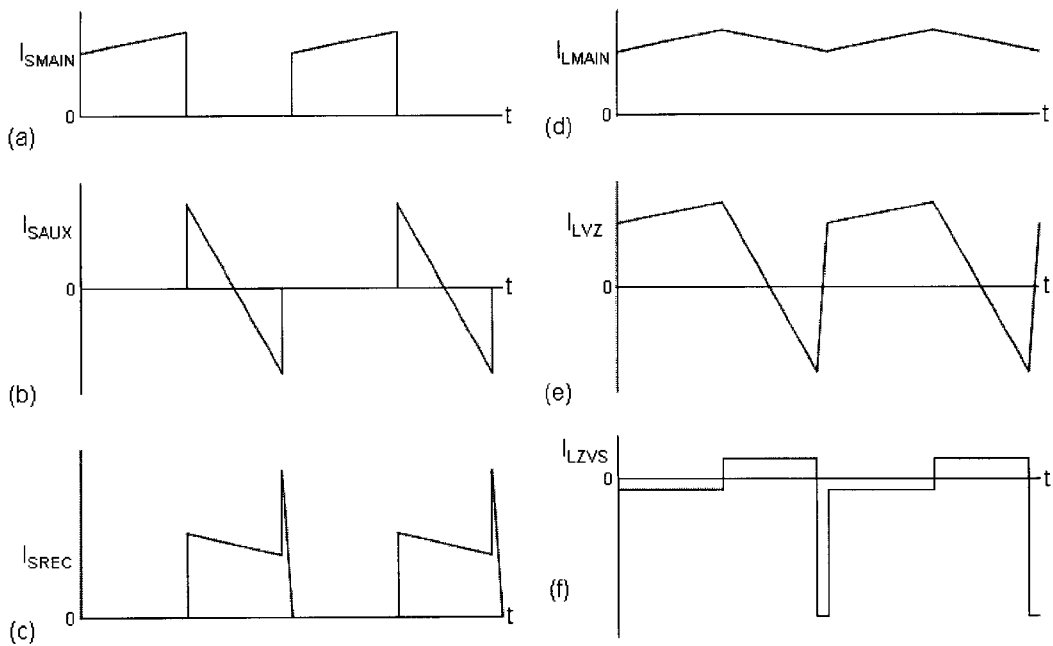
FIG. 3(a) illustrates the wave form of the main switch current for the FIG. 2 circuit.
FIG. 3(b) illustrates the wave form of the auxiliary switch current for the FIG. 2 circuit.
FIG. 3(c) illustrates the wave form of the synchronous rectifier current for the FIG. 2 circuit.
FIG. 3(d) illustrates the wave form of the main inductor current for the FIG. 2 circuit.
FIG. 3(e) illustrates the wave form of the ZVS drive inductor current for the FIG. 2 circuit.
FIG. 3(f) illustrates the wave form of the ZVS drive inductor voltage for the FIG. 2 circuit.

FIG. 1(a) illustrates a small inductor used for ZVS drive energy with an extra lead attached for providing synchronous rectifier self gate drive. FIG. 1(b) illustrates the same inductor with a coupling capacitor connected to it for providing a signal for synchronous rectifier self gate drive. FIG. 1(c) illustrates the ZVS drive inductor with a secondary winding for providing synchronous rectifier self gate drive. FIG. 2 illustrates a ZVS boost converter with synchronous rectifier self gate drive. The ZVS boost converter of the FIG. 2 circuit was first revealed in a pending patent application Ser. No. 09/772,511. FIGS. 3(a) through 3(f) illustrate wave forms for the FIG. 2 circuit. FIG. 3(f) illustrates the voltage wave form for the ZVS drive inductor. The FIG. 3(f) signal is applied as the gate to source voltage of the synchronous rectifier $S_{REC}$ to provide gate drive energy. The timing of the FIG. 3(f) signal is ideal for gate drive of the synchronous rectifier providing a positive step for turning on the synchronous rectifier when the main switch $S_{MAIN}$ turns off and a negative step for turning off the synchronous rectifier just prior to the turn on of the main switch.

Figure 4:
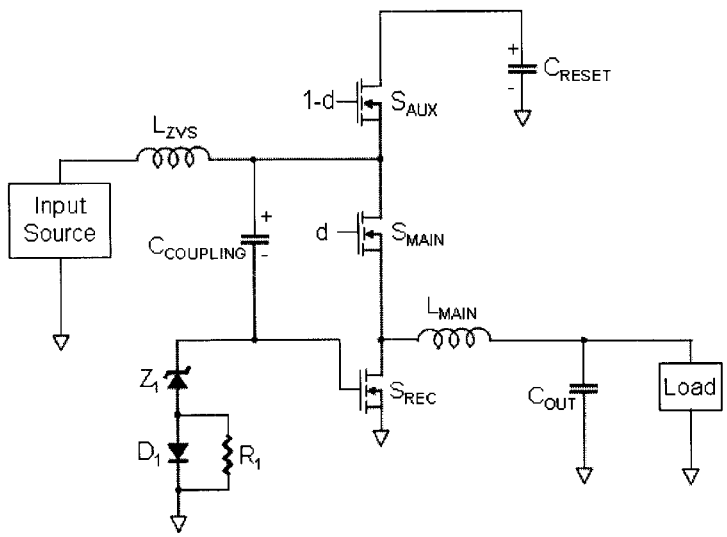
FIG. 4 illustrates a ZVS buck converter with synchronous rectifier self gate drive according to the subject invention.

In a related embodiment a ZVS buck converter with integral filter achieves synchronous rectifier self drive by coupling a capacitor between the ZVS drive choke and the gate of the synchronous rectifier. The ZVS buck converter of FIG. 4 was first revealed in a pending patent Ser. No. 09/956,711. The dc voltage of the ZVS drive choke is too high (positive) for driving the gate of the synchronous rectifier directly, but the ac voltage of the ZVS drive choke is ideal for synchronous rectifier self gate drive. Capacitive coupling the ZVS choke to the gate of the synchronous rectifier removes the dc component of the choke voltage, but the ac component remains. The zener diode $Z_1$ and diode $D_1$ clamp the gate voltage to a range appropriate for driving the synchronous rectifier.

Figure 5:
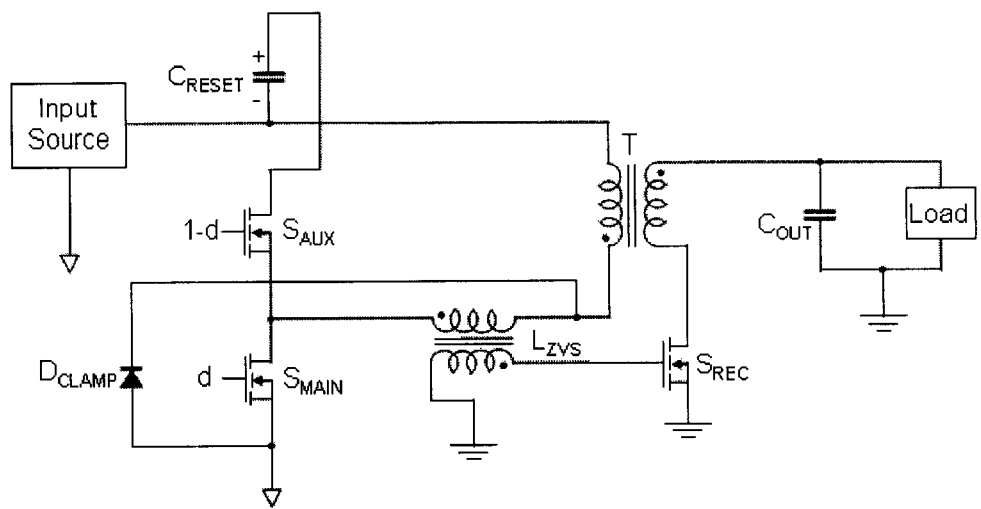
FIG. 5 illustrates a ZVS flyback converter with synchronous rectifier self gate drive according to the subject invention.

In another related embodiment a ZVS flyback converter achieves synchronous rectifier self gate drive for the secondary side synchronous rectifier. The ZVS flyback converter with synchronous rectifier self gate drive is illustrated in FIG. 5. The ZVS flyback converter of FIG. 5 was first revealed in U.S. Pat. No. 5,402,329. Since the ZVS drive choke is placed on the primary side of the circuit and the synchronous rectifier is placed on the secondary side of the circuit a secondary winding is added to the ZVS drive choke to provide the isolation and a drive signal for synchronous rectifier self gate drive.

Figure 6:
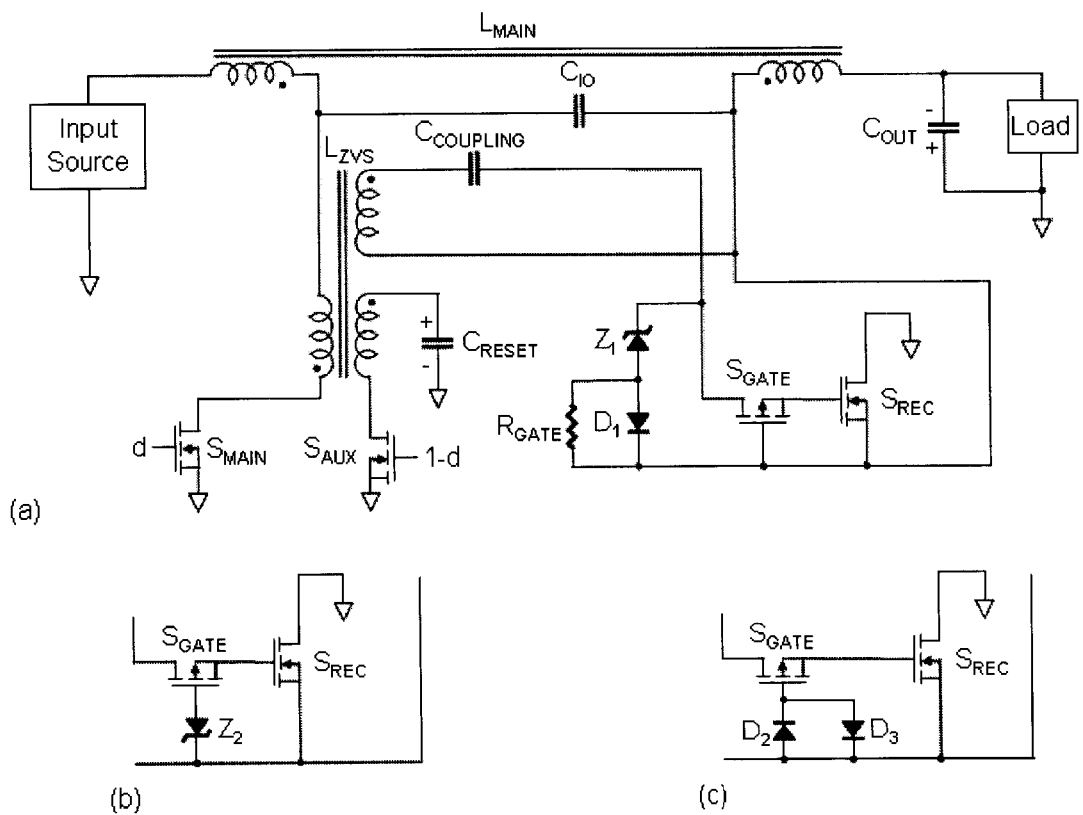
FIG. 6(a) illustrates a ZVS Cuk converter with synchronous rectifier self gate drive and gate charge limiting according to the subject invention.
FIG. 6(b) illustrates a variation of the gate charge limiting circuit of FIG. 6(a).
FIG. 6(c) illustrates another variation of the gate charge limiting circuit of FIG. 6(a).

FIG. 6 illustrates a ZVS Cuk converter that uses a zero voltage switching cell first revealed in a pending patent application Ser. No. 09/956,711. A synchronous rectifier self gate drive mechanism is provided by a secondary winding added to the ZVS drive choke. The secondary winding is coupled to the gate of the synchronous rectifier by a capacitor. The voltage wave form generated by the secondary winding used to provide the synchronous rectifier self gate drive is illustrated in FIG. 3(f). Notice that the FIG. 3(f) wave form has a large negative going spike. The negative going spike provides the turn off transition for the synchronous rectifier. Depending on the magnitude of the negative going spike there is some danger that the negative going spike could exceed the gate breakdown voltage of the synchronous rectifier. Even if there is no danger of gate voltage breakdown, driving the gate of the synchronous rectifier negative provides no benefit, in fact, driving the gate negative adds to the energy circulated into and out of the gate of the synchronous rectifier and contributes to circuit power losses. It would be advantageous to limit the negative voltage swing. To limit the negative voltage swing of the gate of the synchronous rectifier a P channel mosfet is placed in the gate circuit. The P channel mosfet has no effect for the turn on transition since the body diode of the P channel mosfet is forward biased during the turn on transition and the channel of the P channel mosfet is turned on during the turn on transition as the source voltage rises thereby shorting out the body diode. During the turn off transition the P channel mosfet remains on as the gate voltage of the synchronous rectifier falls. At the same time, the gate source voltage of the P channel mosfet is also falling towards its gate threshold voltage. We will assume that the gate threshold voltage of the P channel mosfet is less than the gate threshold voltage of the synchronous rectifier. As the gate voltage of the synchronous rectifier falls it reaches its gate threshold voltage and the synchronous rectifier is turned off. The gate voltage of the synchronous rectifier continues to fall and, soon after the synchronous rectifier turns off, the P channel mosfet also turns off. After the P channel mosfet turns off, the gate voltage of the synchronous rectifier stops falling, since the path of current flow away from the gate of the synchronous rectifier passes through the channel of the P channel mosfet. After the P channel mosfet turns off, the drain voltage of the P channel mosfet continues to fall with the drive signal, while the gate of the synchronous rectifier remains fixed at the gate threshold voltage of the P channel mosfet. It is important in the sequence just described for the turn off transition, that the channel of the P channel mosfet be fully enhanced as the gate voltage of the synchronous rectifier falls through the gate threshold voltage. If the P channel mosfet is not fully enhanced, then the transition will be slowed. If the transition is slowed too much switching losses may be incurred. By placing a low voltage zener diode in the gate of the P channel mosfet, as indicated in FIG. 6(b), the P channel mosfet remains enhanced, until the voltage of the gate of the synchronous rectifier falls to a voltage lower than the gate threshold voltage of the P channel mosfet, by an amount equal to the avalanche or zener voltage of the zener diode in the gate of the P channel mosfet. FIG. 6(c) illustrates a different gate circuit for the P channel mosfet using a pair of anti-parallel diodes that also delays the turn off of the P channel mosfet.

Conclusion, Ramifications, and Scope of Invention

Thus the reader will see that the small inductor common to many ZVS circuits and ZVS cells provides energy and optimal timing for synchronous rectifier self drive. The mosfet placed in the gate circuit of an N channel mosfet synchronous rectifier provides limiting of the gate voltage and energy of the synchronous rectifier, thereby providing improved efficiency.

While my above description contains many specificities, these should not be construed as limitations on the scope of the invention, but rather, as exemplifications or preferred embodiments thereof. Many other variations are possible. For example, converters that use P channel synchronous rectifiers or IGBT synchronous rectifiers are possible, and these synchronous rectifiers could benefit from the circuits and methods revealed herein. Synchronous rectifier self gate drive for other types of ZVS converters or ZVS cells not illustrated herein, but that rely on a small choke to drive ZVS transitions are possible. Accordingly, the scope of the invention should be determined not by the embodiments illustrated, but by the appended claims and their legal equivalents.

I claim:

1. A synchronous rectifier with self gate drive circuit comprising, an inductor having a primary winding which serves as a source of drive energy for a zero voltage turn on transition of a main switch in a zero voltage switching power converter circuit, synchronous rectifier switch means having a control terminal with said control terminal of said synchronous rectifier switch means connected to said inductor, whereby said synchronous rectifier with self gate drive circuit derives energy and timing information for the turn on and turn off of said synchronous rectifier switch means from said inductor.

2. The synchronous rectifier with self gate drive circuit of claim 1 wherein said inductor has both a primary winding and a secondary winding and either said primary winding or said secondary winding is connected to said synchronous rectifier switch means.

3. The synchronous rectifier with self gate drive circuit of claim 1 wherein said inductor is instead coupled to said control terminal of said synchronous rectifier switch means through a capacitor.

4. A gate voltage and energy limiting circuit comprising,
first switch means having a main terminal, a common terminal, and a control terminal,
second complementary switch means having a main terminal, a common terminal, and a control terminal, with said common terminal of said second complementary switch means connected to said control terminal of said first switch means and with said control terminal of said second complementary switch means connected to said common terminal of said first switch means,
control means having first and second terminals with said first terminal of said control means connected to said main terminal of said second complementary switch means and with said second terminal of said control means connected to said control terminal of said first switch means,
whereby the voltage provided by said control means is divided between said complementary switch means and said first switch means thereby limiting the voltage applied to the control terminal of said first switch means and reducing the energy needed to control the turn on and turn off of said first switch means.

5. The gate voltage and energy limiting circuit of claim 4 wherein the connection between said control terminal of said second complementary switch means and said common terminal of said first switch means is broken and further comprising additional circuit elements connected between said common terminal of said first switch means and said control terminal of said second complementary switch means,
whereby said additional circuit elements serve to increase the portion of said voltage of said control means allotted to said first switch means and reduce the portion of said voltage of said control means to said second complementary switch means.

6. The gate voltage and energy limiting circuit of claim 5 wherein said additional circuit elements comprise a zener diode.

7. The gate voltage and energy limiting circuit of claim 5 wherein said additional circuit elements comprise rectifier diodes.

* * * * *